United States Patent [19]

Taguchi

[11] Patent Number: 6,011,768
[45] Date of Patent: Jan. 4, 2000

[54] LASER LIGHT CONTROL CIRCUIT, OPTICAL PICKUP UNIT AND OPTICAL PICKUP DEVICE INCORPORATING THE SAME

[75] Inventor: Toyoki Taguchi, Yokohama, Japan

[73] Assignee: Kabushiki Kaisha Toshiba, Kawasaki, Japan

[21] Appl. No.: 09/034,333

[22] Filed: Mar. 4, 1998

[30] Foreign Application Priority Data

Mar. 4, 1997 [JP] Japan ..................... 9-049431

[51] Int. Cl.⁷ ....................................... G11B 7/00
[52] U.S. Cl. .............................................. 369/116
[58] Field of Search ........................... 369/116, 121, 369/122, 54; 372/29, 31, 33, 38

[56] References Cited

U.S. PATENT DOCUMENTS

| | | | |
|---|---|---|---|
| 4,426,693 | 1/1984 | Satoh et al. ........................ | 369/116 |
| 4,733,398 | 3/1988 | Shibagaki et al. .................. | 369/116 |
| 5,036,519 | 7/1991 | Ena et al. ........................... | 369/116 |
| 5,097,473 | 3/1992 | Taguchi . | |
| 5,495,464 | 2/1996 | Fujikawa et al. ................... | 369/116 |
| 5,579,329 | 11/1996 | Taguchi . | |
| 5,835,476 | 11/1998 | Yamasaki et al. .................. | 369/116 |

FOREIGN PATENT DOCUMENTS

| | | |
|---|---|---|
| 361296539 | 12/1986 | Japan . |
| 363244332 | 10/1988 | Japan . |
| 404172632 | 6/1992 | Japan . |

*Primary Examiner*—Thang V. Tran
*Attorney, Agent, or Firm*—Oblon, Spivak, McClelland, Maier & Neustadt, P.C.

[57] ABSTRACT

A laser light control circuit with low power consumption and a small amount of heat generation by superposing a control current output from a light quantity control circuit with a high-frequency current output from a high frequency current generator on the basis of the control current, includes a bias circuit which sets a bias current of the high-frequency current in response to the operation voltage of a semiconductor laser element.

11 Claims, 5 Drawing Sheets

LASER LIGHT CONTROL CIRCUIT, OPTICAL PICKUP UNIT AND OPTICAL PICKUP DEVICE INCORPORATING THE SAME

BACKGROUND OF THE INVENTION

1. Field of the Invention

The present invention relates to a laser light control system, and more particularly to a high-frequency current superposing circuit for supplying high-frequency current to a semiconductor laser, used as a light source in an optical pickup device for reading out information recorded on optical discs or the like.

Furthermore, the present invention relates to an optical pickup unit having the laser light control circuit and a light pickup device incorporating the laser light control circuit.

2. Description of the Related Art

Optical disc apparatus, such as CD-ROM drives, are widely used as external memory devices for personal computers. In particular, a DVD (Digital Versatile Disc) drive is attracting attention as the potential audio and video apparatus and data recording/reproducing apparatus of the next generation. The development and improvement of DVD devices is accompanied by demands for reducing the size and weight of such devices.

Among the elements from which the optical disc apparatus is comprised, an optical pickup device for reading information recorded on the disc, which comprises a holographic element, a semiconductor laser and a photodetector, has considerable volume and weight and consequently has a large ratio in relation to the overall apparatus. As a result, efforts to reduce the size and weight of the optical disc apparatus have mostly concentrated on the optical pickup device, achieving a variety of improvements to the conventional apparatus.

For example, Japanese Patent Laid-Open No. 3-269835 (1991) discloses a device in which the number of components in the unit has been reduced by positioning the photodetector on the optical path, enabling the size of the optical pickup device to be reduced.

The semiconductor laser, which is used as the light source for the optical pickup device, has the disadvantage of frequent return light noise. Return light noise occurs when a portion of light, which has been radiated from the semiconductor laser onto the surface of the optical disc and then reflected therefrom, returns to the semiconductor laser, thereby generating noise.

In order to solve this problem, a method has been proposed in which not less than 20 mA of high-frequency current, at a frequency of at least 100 MHz, is superposed onto the laser drive current. The circuit for supplying this high-frequency superposed current should preferably be located close to the semiconductor laser, so as to reduce the size of the optical pickup device. However, in general, high-frequency superposing circuits have a power voltage of 5V and a power consumption of not less than 100 mW. The heat which is consequently generated cannot be ignored. Furthermore, the light-generating properties of the semiconductor laser deteriorate at high temperatures, and especially become completely ineffective at temperatures exceeding 70° C. Therefore, conventionally, it has not been possible to provide the high-frequency superposing circuit close to the semiconductor laser.

SUMMARY OF THE INVENTION

Accordingly, it is a primary object of the present invention to provide a laser light control circuit, which has a low power consumption and a low heat generating value.

It is another object of the present invention to provide an optical pickup unit which includes the laser light control circuit.

It is also another object of the present invention to provide an optical pickup device which includes the optical pickup unit.

According to a first aspect of the present invention, there is provided a laser light control circuit for controlling light quantity, having a light quantity controller for controlling a light quantity of a semiconductor laser; and a high-frequency current generator for generating high-frequency current; noise caused by light returning to said semiconductor laser being reduced by superposing a control current which has been output from said light quantity controller, and high-frequency current which has been output from said high-frequency current generator, and thus superposed current being supplied to said semiconductor laser; wherein said high-frequency current generator further comprises: means for generating high-frequency current based on the control current supplied from said light quantity controller; and means for automatically setting a bias current for said high-frequency current in response to an operating voltage of said semiconductor laser.

In this laser light control circuit, since bias current for the high frequency current is automatically set in response to the operating voltage of the semiconductor laser, power consumption and heat generating quantity of the system are reduced and therefore, the high frequency current generating circuit can be located close to the semiconductor laser element.

The laser light control circuit preferably includes an oscillator for outputting an oscillating signal at a predetermined frequency, a high-pass filter (HPF) for removing lower frequency noise from said oscillating signal, a self-bias circuit for outputting a bias voltage at the same frequency as said oscillating signal based on a drive voltage of said semiconductor laser, and a current amplifying element for creating said high-frequency current in accordance with a voltage level of said self-bias voltage.

By providing such a self-bias circuit for supplying a bias voltage at the same frequency as the frequency of the oscillating signal of the high-frequency current generator, based on the operating voltage of the semiconductor laser, the supply of high-frequency current becomes stable during the operation of the semiconductor laser of the light quantity control circuit. In addition, there is no effect on the drive system of the semiconductor laser when the oscillator is switched ON and OFF.

The oscillating frequency of the oscillator is controlled by a current supplied by a first current converter, the output current value of the first current converter being determined in accordance with the resistance of a resistor, which is provided outside the circuit. Therefore, the oscillating frequency can be easily set and altered.

According to the second aspect of the present invention, there is provided an optical pickup unit, comprising:

a semiconductor laser for radiating laser light onto an optical recording medium;

a photoreceptor for detecting a quantity of light radiated by said semiconductor laser and supplying a control signal to a light quantity controller;

a high-frequency current generator, comprising said light quantity controller, a high-frequency current generating circuit for generating high-frequency current using current supplied from said light quantity controller, a bias controller for automatically setting a bias voltage of said high-frequency current using an operating voltage of said semiconductor laser; and light quantity controlling means for superposing control current, supplied from said light quantity controller, and said high-frequency current, supplied from said high-frequency current generator, and supplying these to said semiconductor laser.

Furthermore, according to the third aspect of the present invention, there is provided an optical pickup device, comprising:

an optical pickup unit, comprising:
  a semiconductor laser for radiating laser light onto an optical recording medium;
  a photoreceptor for detecting a quantity of light radiated by said semiconductor laser and supplying a control signal to a light quantity controller;
  a high-frequency current generator, comprising said light quantity controller, a high-frequency current generating circuit for generating high-frequency current using current supplied from said light quantity controller, a bias controller for automatically setting a bias voltage of said high-frequency current using an operating voltage of said semiconductor laser; and
  light quantity controlling means for superposing control current, supplied from said light quantity controller, and said high-frequency current, supplied from said high-frequency current generator, and supplying these to said semiconductor laser; and an object lens for converging light radiated from said semiconductor laser onto a base of said optical recording medium; and an actuator for driving said object lens and performing focusing and tracking of said object lens.

DESCRIPTION OF THE PREFERRED EMBODIMENTS

Detailed description of the preferred embodiments of the present invention will be given with reference to the attached drawings.

Figure 1:
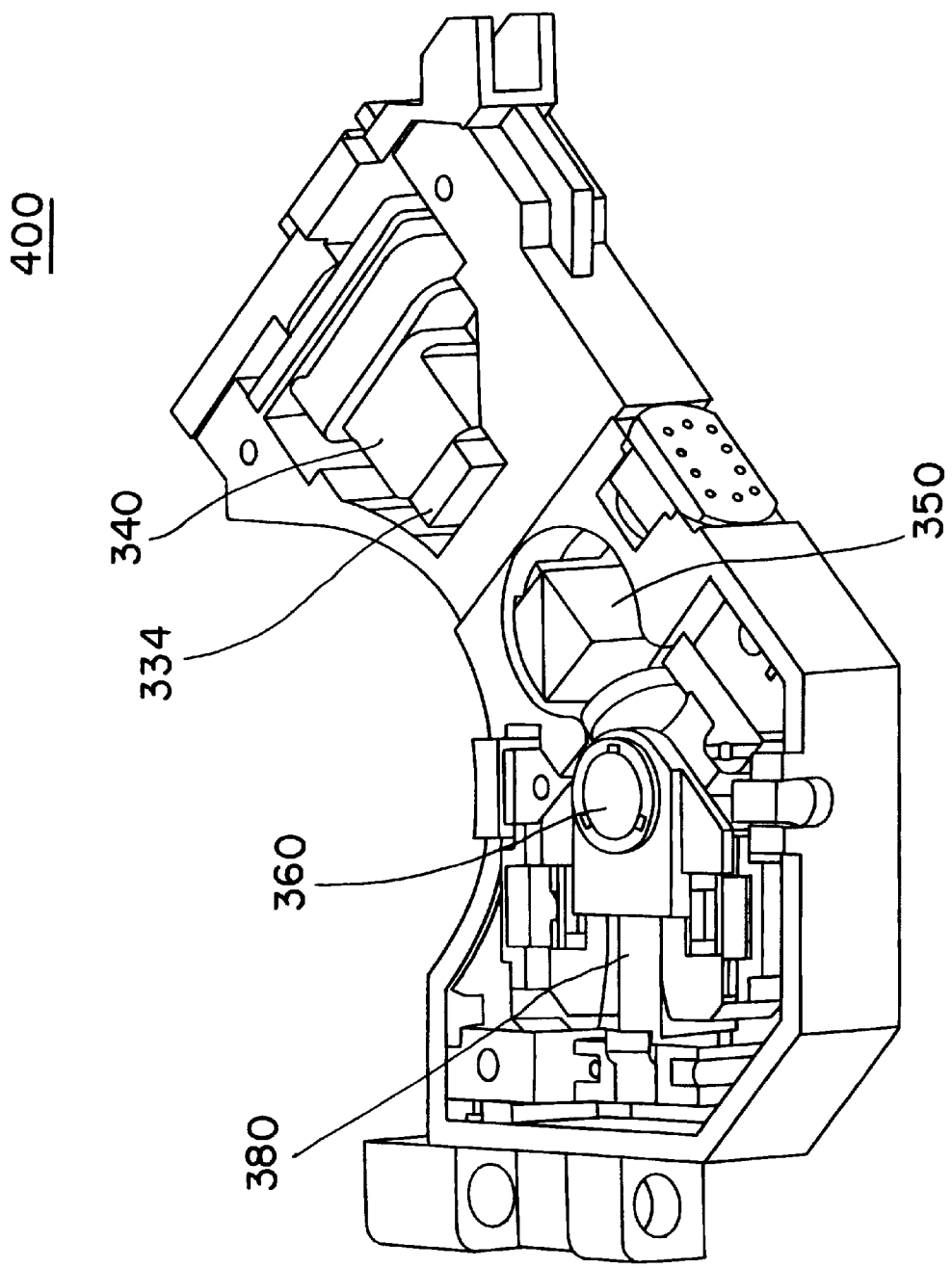
FIG. 1 is a perspective view of the configuration of the optical pickup device of the present invention.
Figure 2:
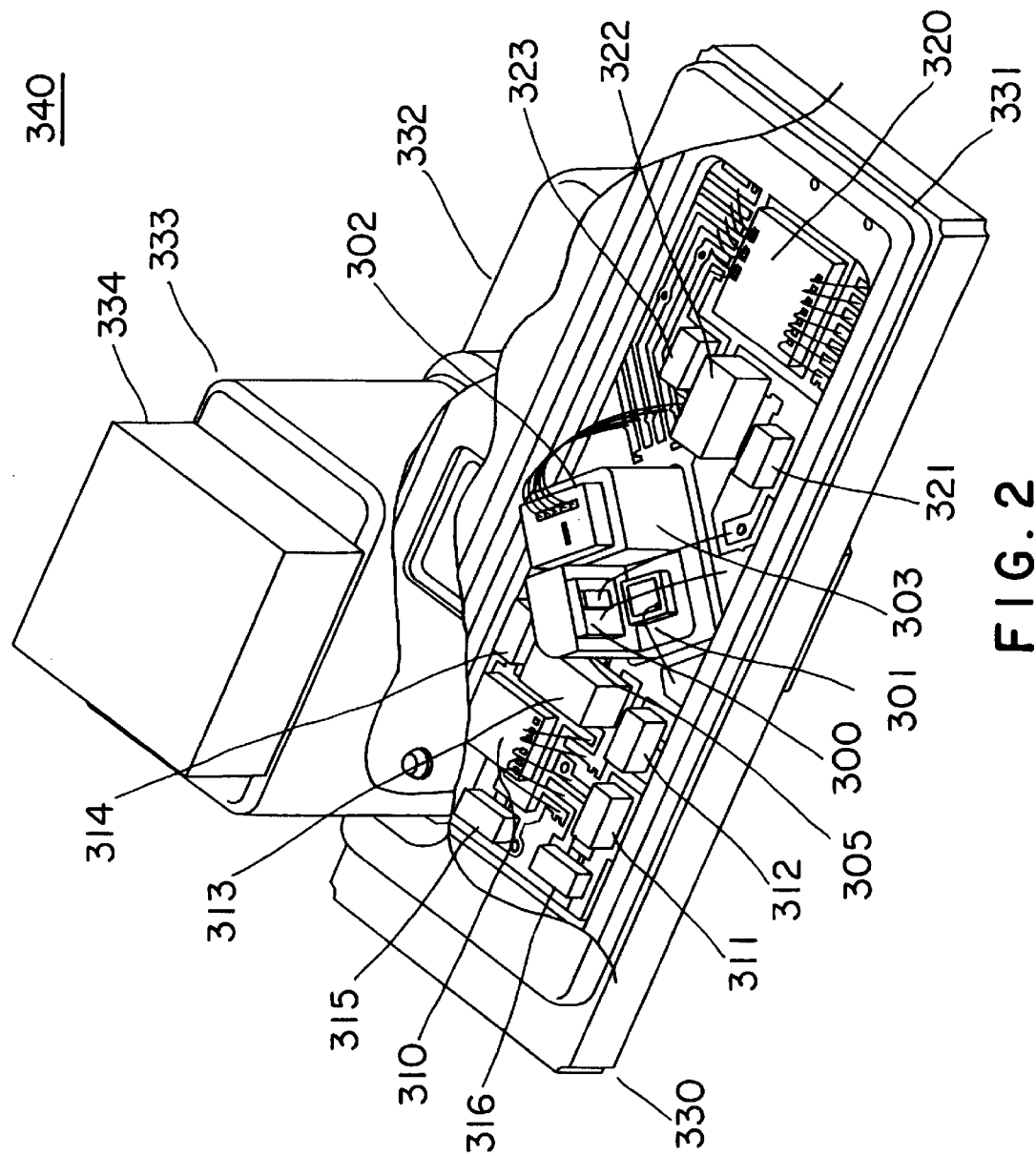
FIG. 2 is a perspective view of the internal configuration of the optical pickup unit of the present invention included in the optical pickup device shown in FIG. 1.

FIG. 1 shows a partially broken perspective view of the internal configuration of an optical pickup device 400 according to the present invention, and FIG. 2, a perspective view of a portion of the internal configuration of the optical system unit 340 shown in FIG. 1.

As FIG. 1 shows, the optical pickup device 400 comprises an optical system unit 340, a polarizing prism 350, and object lens 360 and an actuator 380 for driving the object lens to perform focusing and tracking of the object lens.

As FIG. 2 shows, the optical system unit 340 has a heat sink 303 provided roughly in the center thereof. The heat sink 303 has a photodetector 301 (rear photodiode) and a 4-channel photodiode 302 thereon, and is attached to a semiconductor laser 300 by means of a sub-mount 305. In addition, coil elements 313 and 322, resistive elements 315 and 316, capacitor elements 311, 312, 314, 321, 323 and such like of a filter circuit, a high-frequency current generating integrated circuit 310 for driving the semiconductor layer, a pre-amplifier circuit 320 are located on a ceramic substrate 330, and connected by soldering or bonding. A Kovar ring 331 is provided around the perimeter of the ceramic substrate 330. The entire body of the device is sealed by a sealing case 332 which connects to the ring 331. Furthermore, a polarized hologram element 334, supported by a polarized hologram element holder 333, is provided on top of the case 332.

According to this optical pickup device, laser light, which is emitted from the semiconductor laser 300 in the optical system unit 340, first passes through the polarized hologram element 334. Then, the polarizing prism 350 changes the direction of the laser light, which subsequently passes through the object lens 360 and is radiated onto the DVD (not shown in the diagram).

Light which is reflected from the DVD travels back along the same path as the incoming emitted light and passes into the polarized hologram element 334. The 4-channel photodiode 302 then checks the position of the focal point and the tracking position, and the actuator 380 adjusts the position of each lens in accordance with a predetermined calculation performed by a CPU (not shown in the diagram), which is provided separately.

In this way, after focus and tracking have been adjusted, light signals comprising data which have been recorded in the pits on the disc, are radiated onto the 4-channel photodiode 302, which changes the light signals to electrical signals. The signals also undergo amplification and other such processing, before being output to a personal computer and the DVD drive.

As FIG. 2 shows, the optical system unit 340 has a high-frequency current generating integrated circuit 310 explained later). Therefore, power consumption is extremely low, avoiding any increase in the temperature of the semiconductor laser, and enabling the optical system unit 340 to be provided at extremely small size and light weight.

Figure 3:
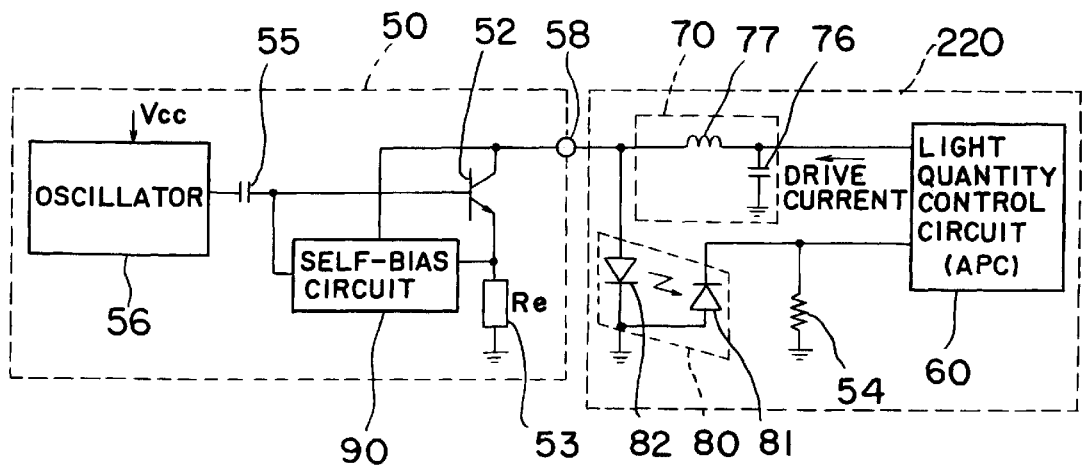
FIG. 3 is a block circuit diagram showing the configuration of an embodiment of the laser light control circuit of the present invention included in the optical pickup unit shown in FIG. 2.

FIG. 3 is a block diagram schematically illustrating a high-frequency current generator 50 and a semiconductor laser drive system 220 used in the present invention. In all subsequent drawings, the same members are designated by the same reference numerals and repeating descriptions will be omitted.

In FIG. 3, the semiconductor laser drive system 220 includes an optical portion 80, a light quantity controller (hereinafter abbreviated to APC) 60, a filter 70 and a resistor 54.

The optical portion 80 has a semiconductor laser 82, which radiates laser light to an optical data medium, such as a DVD, and a photoreceptor 81, such as a photodiode, which detects the light from the semiconductor laser 82 and generates monitor current. The anode of the photoreceptor 81 is connected to the cathode of the semiconductor laser 82.

The cathode of the photoreceptor 81 connects to the input terminal of the APC 60 and to the resistor; the other terminal of the resistor is connected to ground.

The output terminal of the APC 60 is connected via the filter 70 to the anode of the semiconductor laser 82 in the optical portion 80, and the cathode of the semiconductor laser 82 connects to ground. The filter 70 comprises an inductor 77 and a capacitor 76. One of the terminals of the capacitor 76 is connected between the inductor 77 and the APC 60; the other terminal connects to ground.

The high-frequency current generator 50 has an oscillator 56, a self-bias circuit 90 and an output transistor 52. In addition, an emitter resistor 53 is connected between the emitter of the output transistor 52 and the ground terminal.

The oscillator 56 connects via a coupling capacitor 55 to the base of the output transistor 52. Thus, the oscillator 56, the coupling capacitor 55 and the self-bias circuit 90 collectively form a high pass filter (HPF) which restricts the passage of low-frequency noise components included in the oscillating output. One terminal of the self-bias circuit 90 is connected to the coupling capacitor 55 and the base of the output transistor 52. Another terminal of the self-bias circuit 90 connects to the emitter of the output transistor 52 and the emitter resistor 53. Yet another terminal of the self-bias circuit 90 is connected to a collector of the output transistor 52 and to an external terminal 58.

The operation of this semiconductor circuit will next be explained.

Drive current from the APC 60 flows to the filter 70, and are supplied to the semiconductor laser 82 and the high-frequency current generator 50. The semiconductor laser 82 converts the drive current into optical output, and emits laser light. The photoreceptor 81 receives the laser light from the semiconductor laser 82 and supplies a monitor current which monitors output strength to the resistor 54. The terminal voltage, which is generated across the resistor 54 by the monitor current supplied from the photoreceptor 81, is fed back to the APC 60. The APC 60 controls the drive current, in accordance with the monitor current, and supplies the drive current to the semiconductor laser 82 of the optical portion 80. By repeating this operation, an optimum value of drive current can be supplied to the semiconductor laser 82.

The HPF, comprising the coupling capacitor 55 and the self-bias circuit 90, eliminates the low-frequency noise components of the oscillating output, which has been generated by the oscillator 56. In addition, the oscillating output is DC-insulated, with only the oscillating components being supplied to the base of the output transistor 52. The capacitance of the coupling capacitor 55 should preferably be no greater than 10 pF. The high-frequency current, which has been amplified by the output transistor 52, is output from the collector and the external terminal 58, and supplied to the semiconductor laser 82 of the optical portion 80.

The characteristic features of the above high-frequency current generator are, firstly, that the self-bias circuit 90 creates a bias voltage for the output transistor 52 in compliance with the operation voltage of the semiconductor laser 82, and secondly, that high-frequency current is generated in compliance with the drive current supplied by the APC 60.

In other words, the bias voltage of the base of the output transistor 52 is set automatically at the self-bias circuit 90 in compliance with the operating voltage of the semiconductor laser 82. By using this method, the output transistor 52 does not require its own bias power. Moreover, the bias output current (average output current), which is needed so as not to distort the high-frequency current of the output transistor 52, is obtained from the APC 60. Consequently, since the operating voltage of a semiconductor laser is normally around 2.3 v, given a bias current of 10 mA (high-frequency current is 20 mA p-p), the power consumption of the circuits surrounding the output transistor 52 is 23 mW. This is less than half the power consumption in a conventional device, and thus achieves a substantial saving of power, while also avoiding deterioration in the light-generating properties of the semiconductor laser due to high temperature. It is therefore possible to provide the high-frequency current generator 50 close to the semiconductor laser 82, facilitating the prevention of EML (Electromagnetic Interference) and enabling the number of parts which radiate heat to be reduced. A small-sized, lightweight light-beam pickup device can thus be provided.

Figure 4:
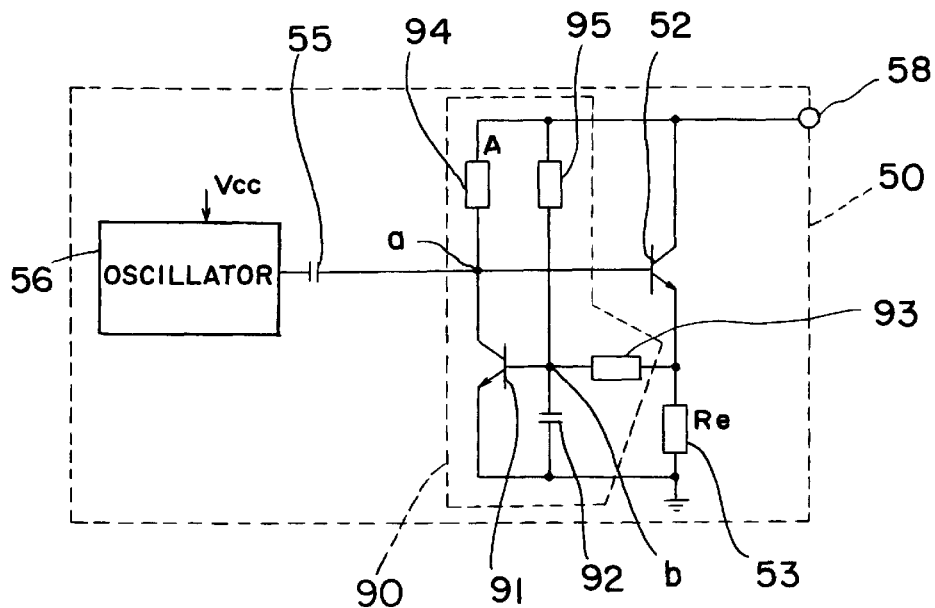
FIG. 4 is a circuit diagram illustrating in detail the self-bias circuit in the circuit shown in FIG. 3.

FIG. 4 shows a detailed configuration of the self-bias circuit 90 of FIG. 3, which comprises a bias adjustment transistor 91, a capacitor 92 and resistors 93 to 95.

As FIG. 4 shows, the base (point b) of the bias adjustment transistor 91 is connected, via resistor 95, to the collector of the output transistor 52, and also to the external terminal 58, which connects to external circuits, namely the APC 60 and the laser 82. In addition, the base of the bias adjustment transistor 91 is connected, via resistor 93, to connection point between the emitter of the output transistor 52 and the emitter resistor 53, one terminal of which is connected to ground. Moreover, the base of the bias adjustment transistor 91 connects, via the capacitor 92, to the emitter of the bias adjustment transistor 91 and the ground side of the emitter resistor 53.

Further, the collector of the bias adjustment transistor 91 connects to the base (point a) of the output transistor 52, and, via resistor 94, to the collector of the output transistor 52 and the external terminal 58. Moreover, the collector of the bias adjustment transistor 91 is connected, via the coupling capacitor 55, to the oscillator 56.

The operation of the self-bias circuit 90 will next be explained.

When the operating voltage of the semiconductor laser 82 (see FIG. 3), namely the terminal voltage of the output terminal 58, rises, the voltage of the base (point a) of the output transistor 52 rises. Since the base voltage (point b) of the bias adjustment transistor 91 also rises, the collector current of the bias adjustment transistor 91 increases, restricting the voltage rise at point a, which returns to the original bias voltage. Alternatively, when the terminal voltage at the output terminal 58 has decreased, the operational sequence is the reverse of that described above. In other words, since the base voltage (point a) of the output transistor 52 and the base voltage (point b) of the bias adjustment output transistor 91 are both lowered, the collector voltage of the bias adjustment output transistor 91 decreases, thereby restricting the voltage decrease at point a, which returns to the original bias voltage.

Ordinarily, the collector current at each transistor will be increased as a result of temperature increase. Here, however, by reducing the base voltage of the output transistor 52, an increase in the collector current of the bias adjustment output transistor 91 is prevented. Conversely, by adjusting the area ratio of the transistors 52 and 91 and adjusting the value of the resistance which is injected to the emitter side of the bias adjustment transistor 91, it is possible to adjust the temperature properties of the output current to a predetermined state. As FIG. 4 shows, power consumption at high temperature can be reduced by removing the resistance on the emitter side of the transistor 91, with the result that when temperature rises, the output current decreases.

Therefore, the self-bias circuit 90 ensures that neither the bias voltage nor the high-frequency current sent from the high-frequency current generator are altered as a result of increases or decreases in the drive current of the APC 60, with no resultant effect on the APC 60 and the semiconductor laser 82.

Thus, as long as the APC 60 is operational, the output transistor 52 is able to operate reliably at the output current which is provided by the APC 60. Also, the output transistor 52 is not affected when the power on the oscillator side 56 is switched ON/OFF.

Next, a second embodiment of the high-frequency current generator of the present invention will be explained with reference to FIG. 5.

Figure 5:
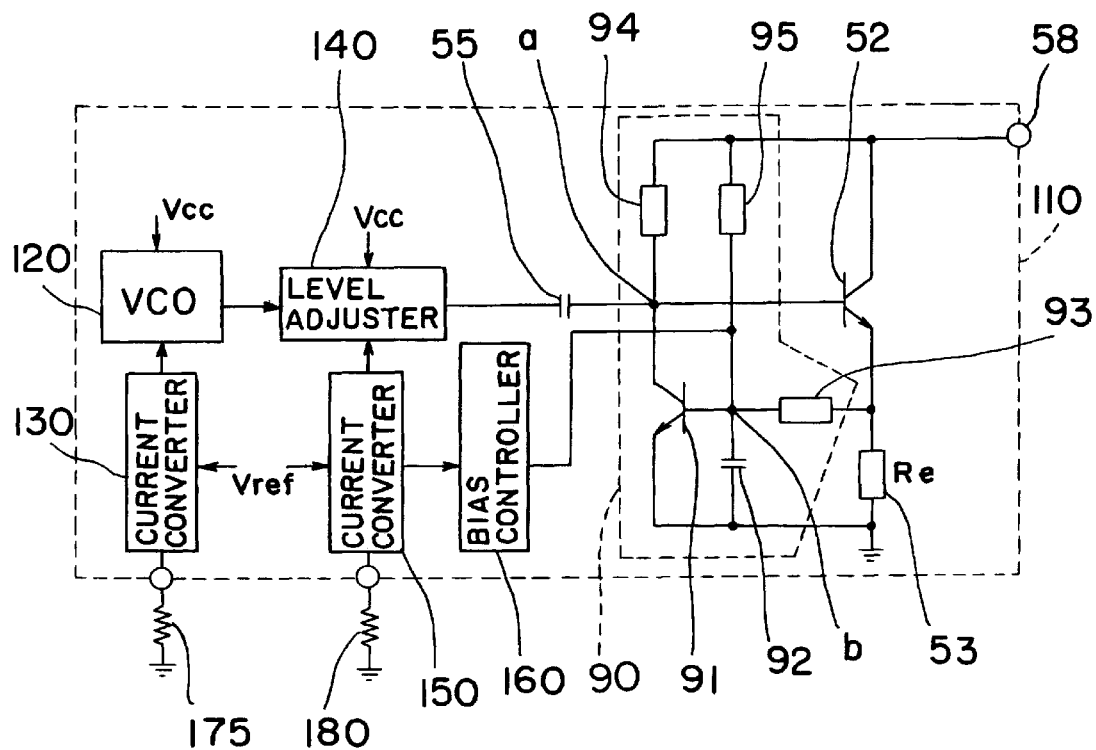
FIG. 5 is a block circuit diagram showing the configuration of a second embodiment of the high-frequency current generator.

As FIG. 5 shows, a high-frequency current generator 110 has the self-bias circuit 90, the output transistor 52 and the emitter resistor 53 shown in FIG. 4, but differs from the first embodiment in respect of the following points.

Here, the self-bias circuit 90 comprises a current converter 130, for converting a voltage provided by the external resistor 175 to current, a voltage-controlled oscillator (VCO) 120, for adjusting the oscillating frequency in accordance with current output from the current converter 130, a current converter 150, for converting a voltage provided by an external resistor 180, a level adjuster 140, for adjusting the amplification of the oscillating signal of the voltage-controlled oscillator 120 in accordance with the current from the external resistor 180 and a bias controller 160, to which a current, also provided by the current converter 150 but being phase-inverted with respect to the current supplied to the level adjuster 140, is supplied. The level adjuster 140 outputs, via a coupling capacitor 55, to the base (point a) of the output transistor 52 of the self-bias circuit 90. The bias controller 160 outputs to the base (point b) of the transistor 91 of the self-bias circuit 90.

The operation of the high-frequency current generator 110 will be explained.

Based on the resistance of the external resistor 175, the current converter 130 creates an oscillating frequency setting current and supplies this to the voltage-controlled oscillator 120. The voltage-controlled oscillator 120 sends a signal, with an oscillating frequency set in compliance with the setting current, to the level adjustment controller 140.

Based on the resistance of the external resistor 180, the current converter 150 generates a current for setting the amplitude of generated current, and supplies this to the level adjuster 140. The level adjuster 140 amplifies the oscillating frequency signal, to an amplitude set according to the current supplied from the current converter 150, and supplies the amplified signal to the self-bias circuit 90.

Furthermore, the current converter 150 generates a current having an inverted phase with respect to that of the current supplied to the level adjuster 140, and supplies it to the base of the bias adjustment transistor 91 of the self-bias circuit 90 through the bias controller 160.

By employing such construction, in the self-bias circuit 90, a dc bias current which is most suitable for the level of the generated current and which has been supplied from the level adjuster 140, is supplied to the base of the output transistor 52. Therefore, the output transistor 52 is able to supply a high-frequency current, at a level in accordance with the amplification level of the high-frequency current input thereto, to the semiconductor laser.

In the high-frequency current generator, since the values of the currents generated by the current converters 130 and 150 are determined in accordance with the resistors 175 and 180 which are provided outside the circuit, the frequency of the high-frequency current to be output is not affected by temperature rises in the circuit. Therefore, a stable supply of high-frequency current can be sent to the semiconductor laser. And, since the resistors 175 and 180 are provided outside the circuit, the resistance values of these resistors 175 and 180 can be easily changed, enabling a user to obtain a high-frequency current having the amplitude level and frequency designated by the user.

Figure 6:
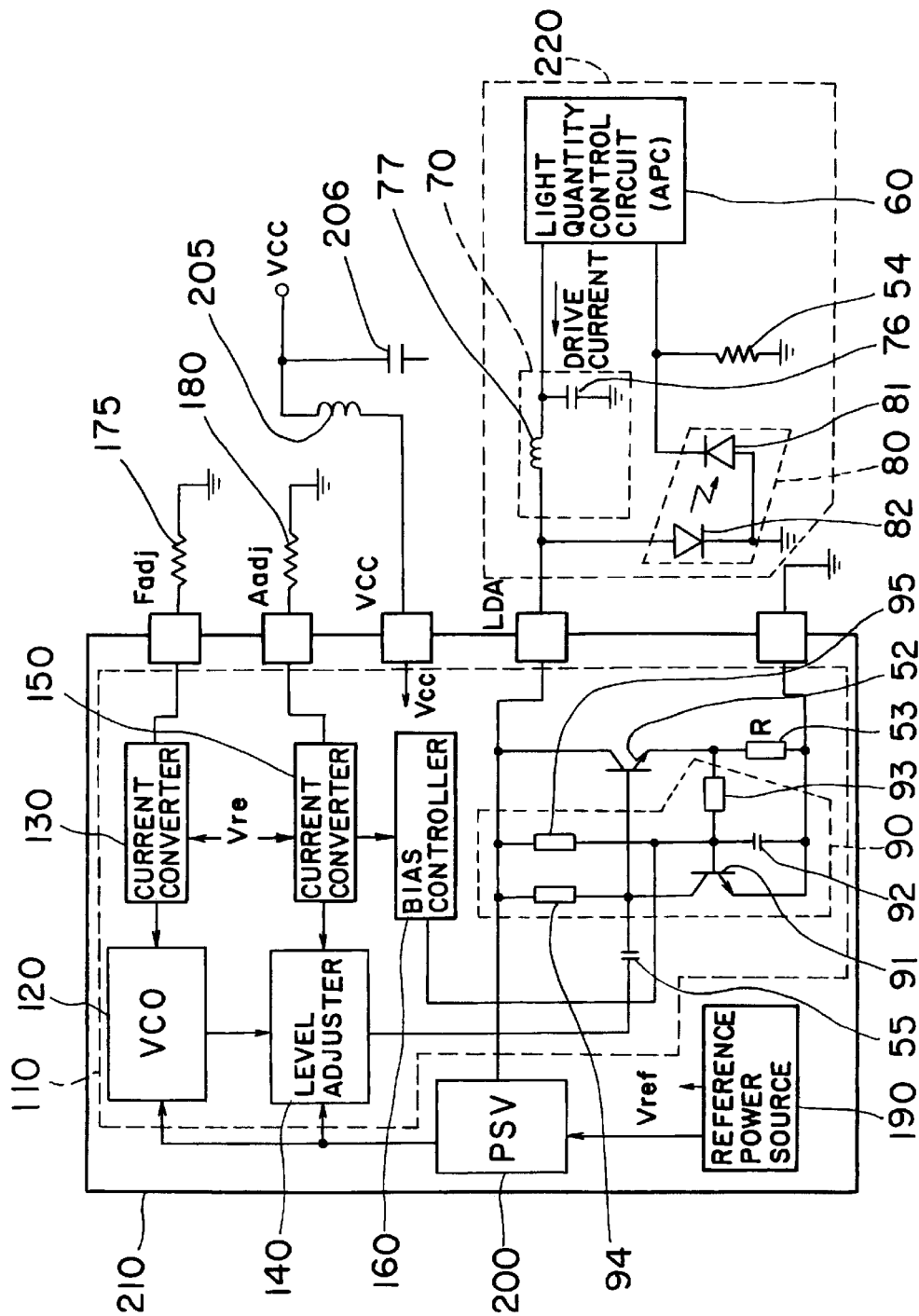
FIG. 6 is a block circuit diagram showing an example of a laser light control circuit incorporating the high-frequency current generator shown in FIG. 5.

Next, FIG. 6 is a block circuit diagram illustrating the overall configuration of the light quantity controller included in the high-frequency current generator 110 shown in FIG. 5.

As FIG. 6 shows, the high-frequency current generator 110 of FIG. 5 is incorporated within a current generator 210, and a power save circuit 200 is connected to the voltage-controlled oscillator 120 and the level adjuster 140. A reference power source 190, for supplying a reference voltage, is connected to the power save circuit 200. Furthermore, one terminal of the power save circuit 200 is connected, via an output portion bias circuit 170 and the collector of the output transistor 52, to the drive system 220 of the semiconductor laser 82.

The current generator 210 is an integrated circuit, having multiple terminals connecting to the outside.

An external resistor 175 is connected to the Fadj terminal, which connects to the current converter 130, and an external resistor 180 is connected to the Aadj terminal, which connects to the current converter 150. In addition, power voltage is supplied, via a filter which comprises a capacitor 206 and an inductance 205, from an outside Vcc power source to a Vcc terminal, which is connected to the current converters 130 and 150. The semiconductor laser drive system 220 is connected to an LDA terminal, which connects to the collector of the output transistor 52.

The power save circuit 200 detects the terminal voltage of the semiconductor laser 82, compares it with the voltage at the reference power source 190, and switches the current generator 210 ON and OFF accordingly. In other words, when the terminal voltage of the semiconductor laser 82 drops below the voltage of the reference power source 190, the power save circuit 200 switches the current generator 210 OFF. Conversely, when the terminal voltage of the semiconductor laser 82 rises above the voltage of the reference power source 190, the current generator 210 is switched ON. For instance, let us imagine a case where the terminal voltage of the semiconductor laser 82 is greater than 2V during radiation. Here, if the reference voltage of the self-bias circuit 90 is set at 1V, when the semiconductor laser 82 is not emitting light, the terminal voltage will consequently be less than 1V. Therefore, the power save circuit 200 switches the current generator 210 OFF. Or, when the semiconductor laser 82 is emitting light, the terminal voltage will exceed 1V; with the result that the power save circuit 200 switches the current generator 210 ON. Then, the high-frequency current is superposed onto the drive current from the APC 60, and supplied to the anode of the semiconductor laser 82.

According to the configuration described above, the current generator 210 comprises the power save circuit 200, which monitors the terminal voltage of the semiconductor laser 82 and switches the circuit ON and OFF as necessary. Consequently, when the semiconductor laser 82 is not emitting light, the high-frequency current generator 210 is switched OFF, thereby avoiding unnecessary consumption of power. As a result, the heat generating value of current generator 210 is greatly reduced, enabling the light-beam pickup optical system unit and optical pickup device, using a semiconductor device which incorporates the high-frequency current generating integrated circuit, to be produced to a smaller size and lighter weight.

By constructing the optical system unit 340, which was explained with reference to FIG. 1 and FIG. 2, according to the configuration illustrated in FIG. 6, power consumption can be considerably reduced and a small-sized and light-weight optical pickup device can be provided.

In the embodiments described above, an NPN transistor was used as the current amplifying element, but a PNP transistor can, of course, be used instead. A MOS device may also be used. Moreover, the materials and shapes of the various components can be modified as appropriate.

While there have been described what are at present considered to be preferred embodiments of the invention, it will be understood that various modifications may be made thereto, and it is intended that the appended claims cover all such modifications as fall within the true spirit and scope of the invention.

What is claimed is:

1. A laser light control circuit for controlling light quantity, having a light quantity controller for controlling a light quantity of a semiconductor laser; and a high-frequency current generator for generating high-frequency current; noise caused by light returning to said semiconductor laser being reduced by superposing a control current which has been output from said light quantity controller, and high-frequency current which has been output from said high-frequency current generator, and thus superposed current being supplied to said semiconductor laser;

wherein said high-frequency current generator further comprises:
   means for generating high-frequency current based on the control current supplied from said light quantity controller; and
   means for automatically setting a bias current for said high-frequency current in response to an operating voltage of said semiconductor laser.

2. The laser light control circuit according to claim 1, wherein said high-frequency current generator further comprises:
   an oscillator for outputting an oscillating signal at a predetermined frequency;
   a high-pass filter (HPF) for removing lower frequency noise from said oscillating signal;
   a self-bias circuit for outputting a bias voltage at the same frequency as said oscillating signal based on a drive voltage of said semiconductor laser; and
   a current amplifying element for creating said high-frequency current in accordance with a voltage level of said self-bias voltage.

3. The laser light control circuit according to claim 2, wherein
   said current amplifying element is an NPN-type first transistor, a drive current of said semiconductor laser being applied at the collector of said first transistor, and said self-bias voltage being applied at the base of said first transistor.

4. The laser light control circuit according to claim 3, wherein
   when said self-bias voltage exceeds a predetermined reference voltage, the self-bias circuit reduces its voltage level by controlling said first transistor in the OFF direction, and when said self-bias voltage is less than said predetermined reference voltage, said self-bias circuit increases its voltage level by controlling said first transistor in the ON direction.

5. The laser light control circuit according to claim 3, wherein said self-bias circuit further comprises:
   a second transistor, a collector of said second transistor being connected via a load to the collector of said current amplifying element, an emitter of said second transistor being connected via a resistor to the emitter of said current amplifying element, and a base of said second transistor being connected to the emitter of said current amplifying element;
   a load, which is connected between the emitter of said current amplifying element and the base of said second transistor; and
   a load, which is connected between the collector of said current amplifying element and the base of said second transistor.

6. The laser light control circuit according to claim 1, wherein
   the oscillating frequency of said oscillator is controlled by a current supplied from a first current converter, the value of the output current of said first current converter being determined based on a resistance of a second resistor which is provided outside the system.

7. The laser light control circuit according to claim 6, wherein
   said oscillator further comprises a level adjusting circuit for controlling the amplitude of the output of said oscillator based on a current supplied from a second current converter, the value of the output current of said second current converter being determined based on a resistance of a third resistor which is provided outside the system.

8. The laser light control circuit according to claim 7, wherein
   said second current converter generates a current, which is phase-inverted with respect to the current supplied to said level adjusting circuit, and supplies this current via a bias controller to said self-bias circuit as a bias current.

9. The laser light control circuit according to claim 1, further comprising:
   a power save circuit for limiting power consumption by monitoring the operating voltage of said semiconductor laser and stopping the oscillations when it is determined that said semiconductor laser is in a stop mode.

10. An optical pickup unit, comprising:
    a semiconductor laser for radiating laser light onto an optical recording medium;
    a photoreceptor for detecting a quantity of light radiated by said semiconductor laser and supplying a control signal to a light quantity controller;
    a high-frequency current generator, comprising said light quantity controller, a high-frequency current generating circuit for generating high-frequency current using current supplied from said light quantity controller, a bias controller for automatically setting a bias voltage of said high-frequency current using an operating voltage of said semiconductor laser; and
    light quantity controlling means for superposing control current, supplied from said light quantity controller, and said high-frequency current, supplied from said high-frequency current generator, and supplying these to said semiconductor laser.

11. An optical pickup device, comprising:

an optical pickup unit, comprising:
- semiconductor laser for radiating laser light onto an optical recording medium;
- a photoreceptor for detecting a quantity of light radiated by said semiconductor laser and supplying a control signal to a light quantity controller;
- a high-frequency current generator, comprising said light quantity controller, a high-frequency current generating circuit for generating high-frequency current using current supplied from said light quantity controller, a bias controller for automatically setting a bias voltage of said high-frequency current using an operating voltage of said semiconductor laser; and
- light quantity controlling means for superposing control current, supplied from said light quantity controller, and said high-frequency current, supplied from said high-frequency current generator, and supplying these to said semiconductor laser; and an object lens for converging light radiated from said semiconductor laser onto a base of said optical recording medium; and an actuator for driving said object lens and performing focusing and tracking of said object lens.

* * * * *